United States Patent
Gengel et al.

(10) Patent No.: US 7,868,766 B2
(45) Date of Patent: *Jan. 11, 2011

(54) RFID TAGS AND PROCESSES FOR PRODUCING RFID TAGS

(75) Inventors: Glenn W. Gengel, Hollister, CA (US);
Mark A. Hadley, Newark, CA (US);
Tom Pounds, Monte Sereno, CA (US);
Kenneth D. Schatz, San Jose, CA (US);
Paul S. Drzaic, Morgan Hill, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/366,617

(22) Filed: Feb. 5, 2009

(65) Prior Publication Data
US 2009/0167534 A1 Jul. 2, 2009

Related U.S. Application Data

(63) Continuation of application No. 11/497,402, filed on Jul. 31, 2006, now Pat. No. 7,489,248, which is a continuation of application No. 10/807,775, filed on Mar. 23, 2004, now Pat. No. 7,253,735.

(60) Provisional application No. 60/457,263, filed on Mar. 24, 2003.

(51) Int. Cl.
*G08B 13/14* (2006.01)

(52) U.S. Cl. ............ 340/572.7; 29/846; 235/492; 257/678; 438/110

(58) Field of Classification Search .......... 340/572.1, 340/572.7; 29/825, 829, 846; 438/106, 107, 438/110; 257/678, 734; 235/492; 361/737, 361/749, 760, 761, 764
See application file for complete search history.

(56) References Cited

U.S. PATENT DOCUMENTS

| 2,551,591 A | 5/1951 | Foord |
| 3,024,151 A | 3/1962 | Robinson |
| 3,390,308 A | 6/1968 | Marley |
| 3,440,027 A | 4/1969 | Hugle |

(Continued)

FOREIGN PATENT DOCUMENTS

DE      2810054     9/1978

(Continued)

OTHER PUBLICATIONS

Electronics Review, Electronics, Jul. 24, 1967, pp. 36-28, 3 pages.

(Continued)

*Primary Examiner*—Thomas J Mullen
(74) *Attorney, Agent, or Firm*—Blakely, Sokoloff, Taylor & Zafman LLP

(57) ABSTRACT

A Radio Frequency Identification (RFID) tag. The RFID tag comprises a flexible substrate and an integrated circuit embedded within the flexible substrate. The top surface of the integrated circuit is coplanar with the flexible substrate. At least one conductive element is formed on the flexible substrate. The conductive element is electrically connected to the integrated circuit. The conductive element serves as an antenna for the RFID tag.

12 Claims, 13 Drawing Sheets

U.S. PATENT DOCUMENTS

| | | |
|---|---|---|
| 3,458,382 A | 7/1969 | Buck |
| 3,689,991 A | 9/1972 | Airo |
| 3,708,860 A | 1/1973 | Bolster et al. |
| 3,724,737 A | 4/1973 | Rodnar |
| 3,891,157 A | 6/1975 | Justus |
| 3,903,590 A | 9/1975 | Yokogawa |
| 3,989,575 A | 11/1976 | Davies et al. |
| 4,331,957 A | 5/1982 | Enander et al. |
| 4,334,672 A | 6/1982 | Felix |
| 4,670,770 A | 6/1987 | Tai |
| 4,783,646 A | 11/1988 | Matsuzaki |
| 4,783,695 A | 11/1988 | Eichelberger et al. |
| 4,795,898 A | 1/1989 | Bernstein et al. |
| 4,918,811 A | 4/1990 | Eichelberger et al. |
| 4,937,653 A | 6/1990 | Blonder et al. |
| 4,957,776 A | 9/1990 | Higuchi et al. |
| 4,990,462 A | 2/1991 | Sliwa, Jr. et al. |
| 5,008,213 A | 4/1991 | Kolesar |
| 5,032,896 A | 7/1991 | Little et al. |
| 5,048,179 A | 9/1991 | Shindo et al. |
| 5,049,978 A | 9/1991 | Bates et al. |
| 5,083,697 A | 1/1992 | Difrancesco |
| 5,138,433 A | 8/1992 | Hiruta |
| 5,138,436 A | 8/1992 | Koepf et al. |
| 5,188,984 A | 2/1993 | Nishiguchi |
| 5,205,032 A | 4/1993 | Kuroda |
| 5,212,625 A | 5/1993 | van Andel et al. |
| 5,231,751 A | 8/1993 | Sachdev et al. |
| 5,241,456 A | 8/1993 | Marcinkiewicz et al. |
| 5,298,685 A | 3/1994 | Bindra et al. |
| 5,353,498 A | 10/1994 | Fillion et al. |
| 5,373,627 A | 12/1994 | Grebe |
| 5,422,513 A | 6/1995 | Marcinkiewicz |
| 5,430,441 A * | 7/1995 | Bickley et al. ............ 340/572.7 |
| 5,434,751 A | 7/1995 | Cole et al. |
| 5,435,057 A | 7/1995 | Bindra et al. |
| RE35,119 E | 12/1995 | Blonder |
| 5,517,752 A | 5/1996 | Sakata et al. |
| 5,528,222 A * | 6/1996 | Moskowitz et al. ....... 340/572.7 |
| 5,541,613 A | 7/1996 | Santadrea et al. |
| 5,554,996 A | 9/1996 | Chatzipetros |
| 5,566,441 A * | 10/1996 | Marsh et al. .................. 29/600 |
| 5,574,470 A * | 11/1996 | de Vall .................... 340/572.7 |
| 5,612,254 A | 3/1997 | Mu et al. |
| 5,627,931 A | 5/1997 | Ackley et al. |
| 5,645,932 A | 7/1997 | Uchibori |
| 5,682,143 A * | 10/1997 | Brady et al. ............. 340/572.7 |
| 5,707,902 A | 1/1998 | Chang et al. |
| 5,708,419 A * | 1/1998 | Isaacson et al. .......... 340/572.5 |
| 5,735,040 A | 4/1998 | Ochi et al. |
| 5,745,984 A | 5/1998 | Cole, Jr. et al. |
| 5,798,050 A | 8/1998 | Gaynes et al. |
| 5,824,186 A | 10/1998 | Smith et al. |
| 5,862,117 A | 1/1999 | Fuentes et al. |
| 5,910,770 A | 6/1999 | Ohara |
| 6,044,046 A | 3/2000 | Diezmann et al. |
| 6,064,116 A | 5/2000 | Akram |
| 6,082,600 A | 7/2000 | Angus et al. |
| 6,091,332 A | 7/2000 | Eberhardt et al. |
| 6,140,146 A | 10/2000 | Brady et al. |
| 6,189,208 B1 | 2/2001 | Estes et al. |
| 6,194,119 B1 | 2/2001 | Wolk et al. |
| 6,204,163 B1 | 3/2001 | Panchou et al. |
| 6,211,572 B1 | 4/2001 | Fjelstad et al. |
| 6,219,911 B1 | 4/2001 | Estes et al. |
| 6,222,212 B1 | 4/2001 | Lee et al. |
| 6,229,203 B1 | 5/2001 | Wojnarowski et al. |
| 6,246,327 B1 * | 6/2001 | Eberhardt ................ 340/572.7 |
| 6,259,408 B1 | 7/2001 | Brady et al. |
| 6,271,801 B2 | 8/2001 | Tuttle et al. |
| 6,274,391 B1 | 8/2001 | Wachtler et al. |
| 6,280,544 B1 | 8/2001 | Fox et al. |
| 6,281,794 B1 | 8/2001 | Duan et al. |
| 6,297,072 B1 | 10/2001 | Tilmans et al. |
| 6,309,912 B1 | 10/2001 | Chiou et al. |
| 6,320,543 B1 | 11/2001 | Ohata et al. |
| 6,329,917 B1 * | 12/2001 | Leonard .................. 340/572.7 |
| 6,357,005 B1 | 3/2002 | Devaux et al. |
| 6,395,373 B2 | 5/2002 | Conti et al. |
| 6,410,415 B1 | 6/2002 | Estes et al. |
| 6,417,025 B1 | 7/2002 | Gengel et al. |
| 6,420,266 B1 | 7/2002 | Smith et al. |
| 6,448,109 B1 | 9/2002 | Karpman |
| 6,451,154 B1 | 9/2002 | Grabau et al. |
| 6,459,084 B1 | 10/2002 | Boreman et al. |
| 6,468,638 B2 | 10/2002 | Jacobsen et al. |
| 6,486,780 B1 | 11/2002 | Garber et al. |
| 6,514,790 B1 | 2/2003 | Plettner et al. |
| 6,523,734 B1 | 2/2003 | Kawai et al. |
| 6,528,351 B1 | 3/2003 | Nathan et al. |
| 6,530,649 B1 | 3/2003 | Pan |
| 6,542,444 B1 | 4/2003 | Rutsche |
| 6,549,064 B2 | 4/2003 | Bandy et al. |
| 6,559,666 B2 | 5/2003 | Bernier et al. |
| 6,590,346 B1 | 7/2003 | Hadley et al. |
| 6,611,237 B2 | 8/2003 | Smith |
| 6,653,157 B2 | 11/2003 | Kondo |
| 6,665,044 B1 | 12/2003 | Jacobsen et al. |
| 6,677,186 B1 | 1/2004 | Zafrany et al. |
| 6,696,785 B2 | 2/2004 | Shimoda et al. |
| 6,780,696 B1 | 8/2004 | Schatz |
| 6,794,221 B2 | 9/2004 | Sayyah |
| 6,844,673 B1 | 1/2005 | Bernkopf |
| 6,850,312 B2 | 2/2005 | Jacobsen et al. |
| 6,853,087 B2 | 2/2005 | Neuhaus et al. |
| 6,856,086 B2 | 2/2005 | Grace et al. |
| 6,863,219 B1 | 3/2005 | Jacobsen et al. |
| 6,867,983 B2 * | 3/2005 | Liu et al. ..................... 361/761 |
| 6,908,295 B2 | 6/2005 | Thielman et al. |
| 6,919,680 B2 | 7/2005 | Shimoda et al. |
| 6,951,596 B2 | 10/2005 | Green et al. |
| 6,957,481 B1 | 10/2005 | Patrice |
| 6,985,361 B2 | 1/2006 | Credelle et al. |
| 7,014,729 B2 | 3/2006 | Grabau et al. |
| 7,017,807 B2 | 3/2006 | Kipp et al. |
| 7,045,186 B2 | 5/2006 | Grabau et al. |
| 7,046,328 B2 | 5/2006 | Jacobsen et al. |
| 7,102,520 B2 | 9/2006 | Liu et al. |
| 7,113,250 B2 | 9/2006 | Jacobsen et al. |
| 7,120,987 B2 | 10/2006 | Liu et al. |
| 7,158,037 B2 | 1/2007 | Forster et al. |
| 7,236,093 B2 | 6/2007 | Stromberg |
| 7,253,735 B2 * | 8/2007 | Gengel et al. ............ 340/572.7 |
| 7,260,247 B2 | 8/2007 | Kita |
| 7,298,330 B2 | 11/2007 | Forster et al. |
| 7,353,598 B2 | 4/2008 | Craig et al. |
| 7,361,251 B2 | 4/2008 | Green et al. |
| 7,368,032 B2 | 5/2008 | Green et al. |
| 2001/0000631 A1 | 5/2001 | Zandman et al. |
| 2001/0030628 A1 | 10/2001 | Brady et al. |
| 2001/0031514 A1 | 10/2001 | Smith et al. |
| 2001/0035759 A1 | 11/2001 | Bernier et al. |
| 2001/0055835 A1 | 12/2001 | Pendse |
| 2002/0001046 A1 | 1/2002 | Jacobsen et al. |
| 2002/0018357 A1 | 2/2002 | Oguchi et al. |
| 2002/0041234 A1 | 4/2002 | Kuzma et al. |
| 2002/0061392 A1 | 5/2002 | Jacobsen et al. |
| 2002/0093396 A1 | 7/2002 | Smith et al. |
| 2002/0097664 A1 | 7/2002 | Ono |
| 2002/0167450 A1 | 11/2002 | Korden et al. |
| 2003/0034400 A1 | 2/2003 | Han et al. |
| 2003/0036249 A1 | 2/2003 | Bauer et al. |
| 2003/0054881 A1 | 3/2003 | Hedrick et al. |
| 2003/0089444 A1 | 5/2003 | Melzer et al. |

| | | | |
|---|---|---|---|
| 2003/0112192 A1 | 6/2003 | King et al. | |
| 2003/0121986 A1 | 7/2003 | Stromberg et al. | |
| 2003/0136503 A1 | 7/2003 | Green | |
| 2004/0052202 A1 | 3/2004 | Brollier | |
| 2004/0052203 A1 | 3/2004 | Brollier | |
| 2004/0089408 A1 | 5/2004 | Brod et al. | |
| 2004/0142766 A1 | 7/2004 | Savarese et al. | |
| 2005/0070375 A1 | 3/2005 | Savarese et al. | |
| 2005/0093678 A1 | 5/2005 | Forster et al. | |
| 2005/0276210 A1 | 12/2005 | Reiter et al. | |
| 2006/0012527 A1 | 1/2006 | Kai et al. | |
| 2006/0022287 A1 | 2/2006 | Itoi et al. | |
| 2006/0210769 A1 | 9/2006 | Swindlehurst et al. | |
| 2007/0031992 A1 | 2/2007 | Schatz | |

FOREIGN PATENT DOCUMENTS

| | | | |
|---|---|---|---|
| DE | 3203943 | | 8/1983 |
| DE | 8709503 U1 | | 7/1987 |
| DE | 4427309 | | 8/1994 |
| DE | 19534480 | | 9/1994 |
| DE | 19745648 | | 10/1997 |
| DE | 19840226 | | 3/2000 |
| DE | 10017431 | | 10/2001 |
| DE | 2810005 | | 3/2004 |
| EP | 0277606 | | 8/1988 |
| EP | 0450950 | | 10/1991 |
| EP | 0498703 | | 8/1992 |
| EP | 0952543 | | 10/1999 |
| EP | 1035418 | | 9/2000 |
| EP | 1035503 | | 9/2000 |
| EP | 1039543 | | 9/2000 |
| EP | 111 1537 A2 | | 7/2001 |
| EP | 1302893 | | 4/2006 |
| FR | 2806029 | | 3/2000 |
| GB | 2341166 | | 3/2000 |
| JP | 200023614 | | 8/2000 |
| WO | WO 01/02060 | | 1/1987 |
| WO | WO 8802549 | | 4/1988 |
| WO | WO 98/15981 | | 4/1998 |
| WO | WO 98/54681 | | 12/1998 |
| WO | WO 99/41721 | | 8/1999 |
| WO | WO 00/14789 | | 3/2000 |
| WO | WO 00/16493 | | 3/2000 |
| WO | WO 00/23994 A | | 4/2000 |
| WO | WO 01/54058 | | 7/2001 |
| WO | WO 01/61646 | | 8/2001 |
| WO | WO 01/95241 | | 12/2001 |
| WO | WO 01/95252 | | 12/2001 |
| WO | WO 02/49093 | | 6/2002 |
| WO | WO 02/089051 | | 11/2002 |
| WO | WO 03/105063 | | 12/2003 |
| WO | WO 2004/006259 | | 1/2004 |
| WO | WO 2004/005494 | | 3/2004 |

OTHER PUBLICATIONS

Gilleo, K, Handbook of Flexible Circuits, Chpt 2, Chpt 7, (1992) 11 pages.
Grossman, S.E. "Film-Carrier Technique Automates the Packaging of IC Chips" May 16, 1974, pages 89-95, 7 pages.
Hannke, Bittner & Partner, Opposition to the Grant of EP1470528, filed with the EPO, dated Feb. 16, 2007.
Patstone, W., Edn, "Tape-Carrier packaging Boasts Almost Unlimited Potential" Oct. 1974, A Cahners Publication, 8 pages.
PCT Search Report PCT/US00/02348 mailed Apr. 5, 2000; 5 pages.
Scrupski, S.E., "Ics on Film Strip Lead Themselves to Automatic Handling by Manufacturer and User, Too", Electronics, Feb. 1, 1971, ages 44-48, total 5 pages.
Van Der Drift, et al. Philips Technical Review, "Integrated Circuits with Leads on Flexible Tape" vol. 34(4), 1974 pp. 85-95, 11 pages.
PCT Notification of Transmittal of International Preliminary Examination report for PCT Application No. PCT US02/16474. Mailed Jul. 21, 2005 (5 pages).
PCT Notification of Transmittal of International Search Report and the Written Opinion of the International Searching Authority, or the Declaration for PCT/US2005/040772, mailed on Jul. 26, 2006 (15 pages).
Kriebel, Frank (2005). RFID Chip and Tag Assembly Challenges: Low Cost RFID IC Packaging and Assembly Workshop, Nov. 14, 2005, Munich, Germany. (12 pgs).
IPRP Chapter 1, PCT Application No. PCT/US2005/002534, (9 pages) mailed Aug. 10, 2006.
PCT Notification of Transmittal of International Search Report and the Written Opinion of the International Searching Authority for PCT/US2004/09070, mailed on Feb. 10, 2005 (12 pages).

* cited by examiner

350um

350um

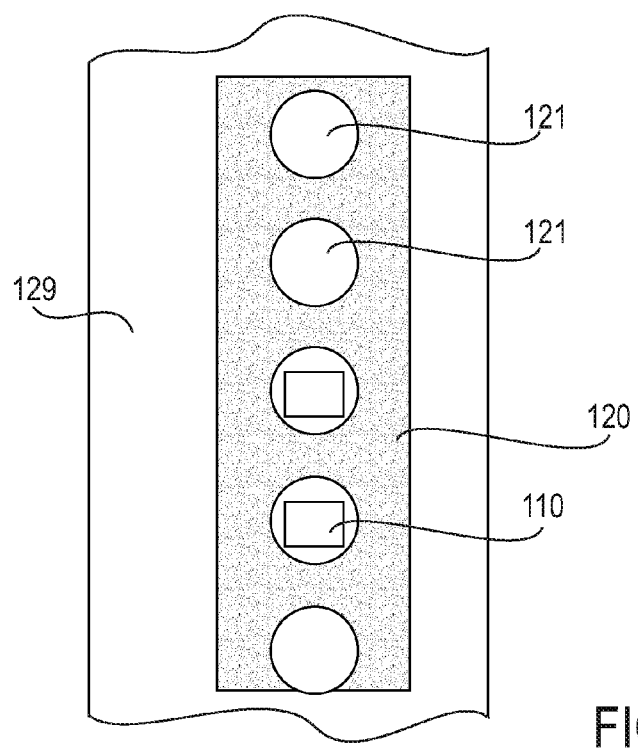
FIG 12
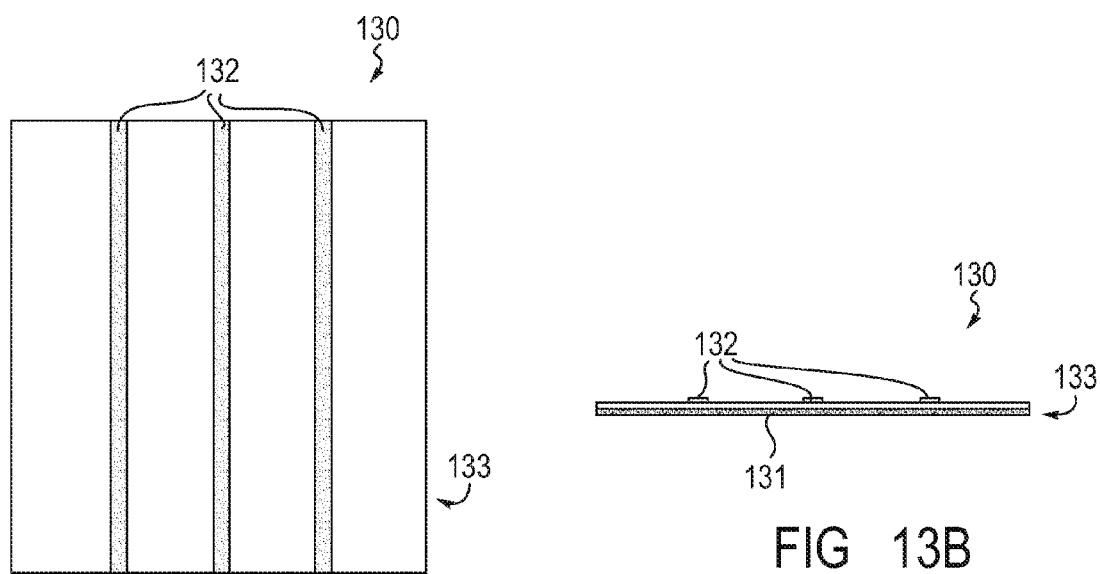
FIG 13A
FIG 13B

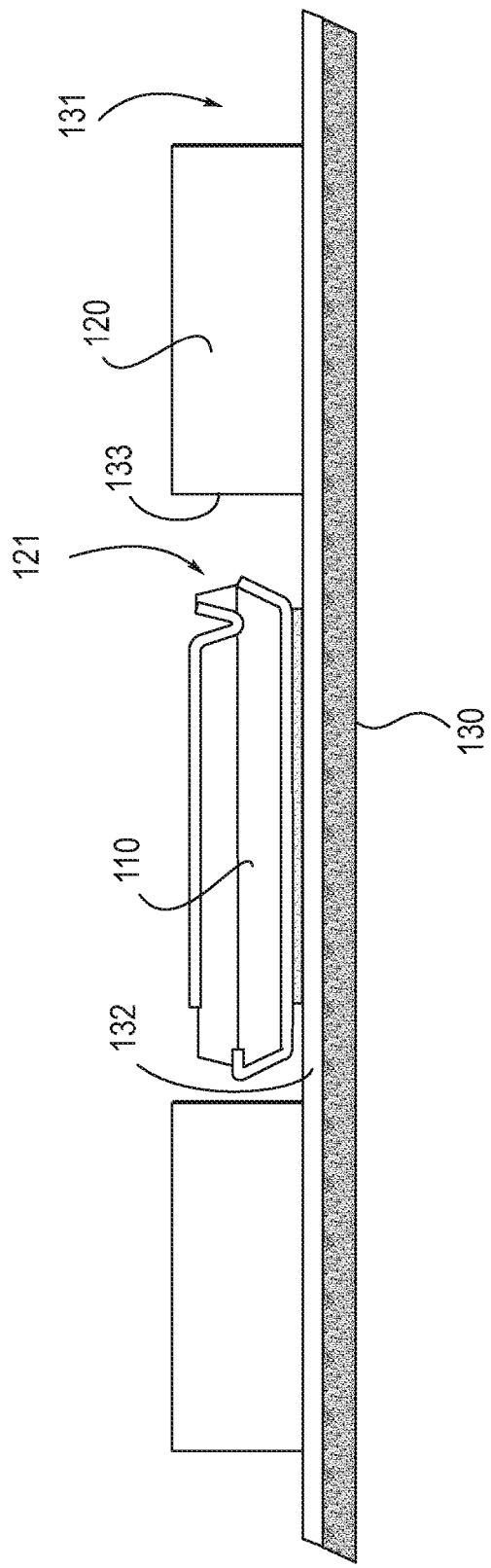

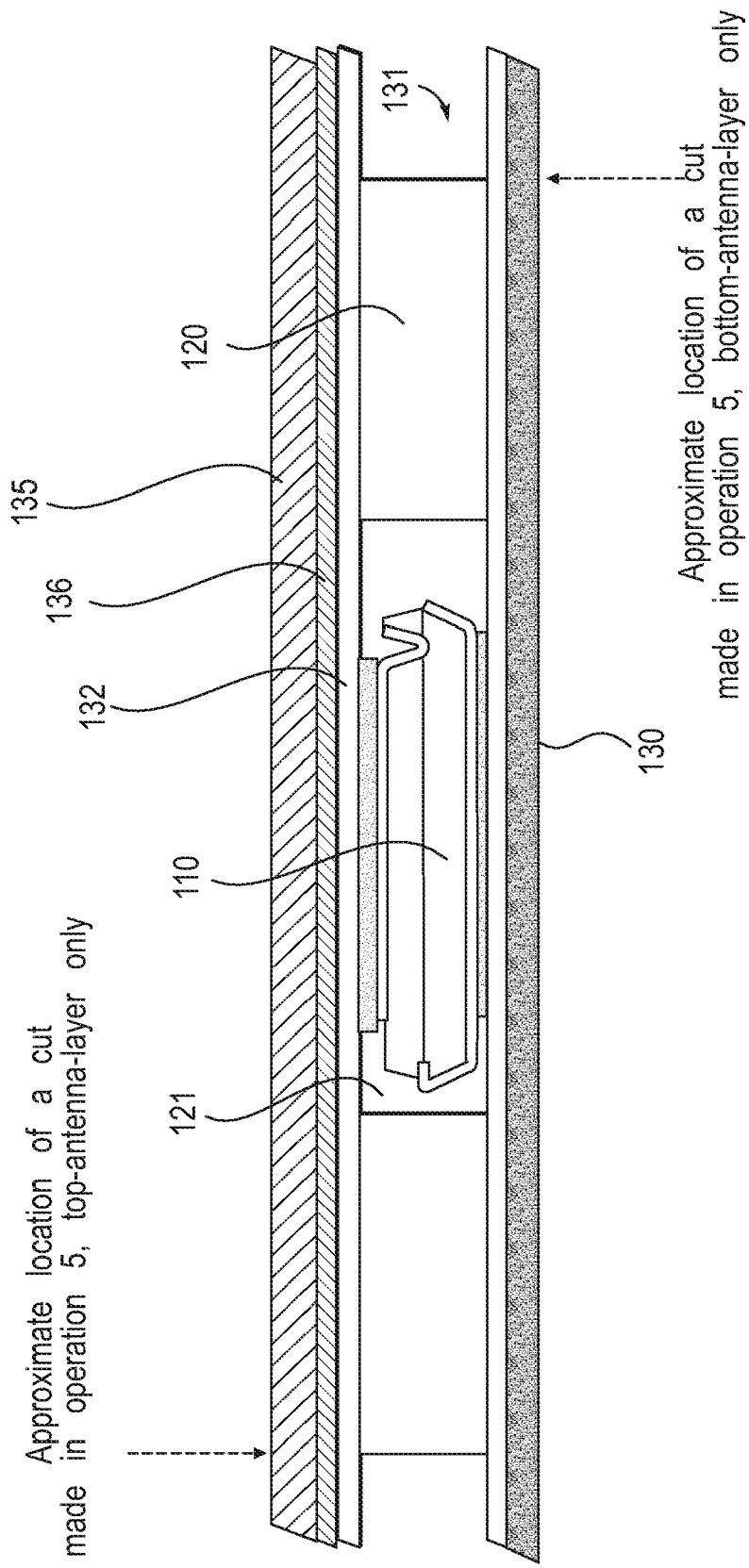

RFID TAGS AND PROCESSES FOR PRODUCING RFID TAGS

RELATED APPLICATIONS

This application is a continuation of U.S. patent application Ser. No. 11/497,402, filed on Jul. 31, 2006 (now issued as U.S. Pat. No. 7,489,248), which is a continuation of U.S. patent application Ser. No. 10/807,775, filed on Mar. 23, 2004 (now issued as U.S. Pat. No. 7,253,735), and this application is also related to and claims the benefit of U.S. Provisional Patent application Ser. No. 60/457,263 filed Mar. 24, 2003, which is hereby incorporated by reference in its entirety.

GOVERNMENT RIGHT NOTICE

This invention was made with government support under North Dakota State University Subcontract SB004-03, Defense Microelectronics Activity (DMEA) Sponsor Cooperative Agreement No. 90-03-2-0303 (prime). The government has certain rights to this invention.

BACKGROUND

1). Field

Embodiments of the present invention relate generally to the Radio Frequency Identification (RFID) devices or tags and methods of making RFID devices or tags.

2). Description of the Related Art

Radio frequency identification (RFID) tags allow for the remote identification of objects through the use of radio waves.

Certain embodiments of the present inventions described here are aimed at improving the present state of RFID technology by lowering assembly cost, by providing new and useful form factors, or by enabling new applications of RFID. While the designs and processes described here can be used to form many types of electronic assemblies (e.g. sensors or arrays for antennas or other devices which are not RFID tags), they are particularly useful for RFID tags, where cost, size, and form factor are desirable elements.

Demands for RFID tags are expanding into many applications from small merchandises to large merchandises. It is desirable to have the RFID tags be made as small as possible and as flexible as possible to enable the effective incorporation of the RFID tags into various merchandises. Also, it is desirable to have the RFID tags to be made as least expensive as possible to allow for wide integration of the RFID tags to into various merchandises.

SUMMARY

The exemplary embodiments of the present invention pertain to a Radio Frequency Identification (RFID) tag. The RFID tag comprises a flexible substrate and an integrated circuit embedded within the flexible substrate. The top surface of the integrated circuit is coplanar with the flexible substrate. At least one conductive element is formed on the flexible substrate. The conductive element is electrically connected to the integrated circuit. The conductive element serves as an antenna for the RFID tag.

According to an aspect of the invention, an RFID tag comprises a flexible substrate and an integrated circuit embedded within the flexible substrate. The top surface of the integrated circuit is coplanar with the flexible substrate. The integrated circuit is embedded within the flexible substrate using a fluidic self assembly (FSA) process. A planarization layer is formed over the flexible substrate and the integrated circuit. At least one conductive element is formed on the flexible substrate and is electrically connected to the integrated circuit through at least one via created in the planarization layer. The conductive element serves as an antenna for the RFID tag.

According to another aspect of the invention, an RFID tag comprises a flexible substrate and an integrated circuit embedded within the flexible substrate. The integrated circuit has a top surface that is coplanar with the flexible substrate. The conductive elements are formed on the flexible substrate and electrically connected to the integrated circuit. The conductive elements also serve as an antenna for the RFID tag. The conductive elements are formed on a top surface and bottom surface of the substrate. An electrical connection is provided to connect the conductive element on the bottom surface to the integrated circuit.

According to another aspect of the invention, an RFID tag comprises an RFID integrated circuit deposited in a flexible substrate. A first antenna layer is coupled to the RFID integrated circuit. A second antenna layer is coupled to the RFID integrated circuit. The first antenna layer is above the RFID integrated circuit and the second antenna layer is below the RFID integrated. The RFID integrated circuit is coupled to the first antenna layer at the top of the RFID integrated circuit. The RFID integrated circuit is coupled to the second antenna layer at the bottom of the RFID integrated circuit.

Another aspect of the invention pertains to a method of assembling blocks where alignment is not critical. The method includes combining blocks, each containing a functional component, with a fluid to form a slurry. The slurry is then dispensed over a substrate having receptor holes, each of which is designed to receive one of the blocks. The relative size of each hole and block is such that each block is not axially aligned relative to a perimeter of the receptor holes. Each block is configured to include a bottom contact pad and a top contact pad that allow the functional component of the block to interconnect to conductive elements formed on the substrate even when each block is not axially aligned relative to the perimeter of the receptor holes.

In other aspects, methods of making exemplary embodiments of the RFID tags of the present invention are also described.

BRIEF DESCRIPTION OF THE DRAWINGS

Embodiments of the present invention are illustrated by way of examples and not limitations in the figures of the accompanying drawings, in which like references indicate similar elements and in which:

FIG. 12 illustrates an exemplary embodiment of assembling RFID tags in accordance with some embodiments of the present invention;

FIGS. 13A-13B illustrate another exemplary embodiment of assembling RFID tags in accordance with some embodiments of the present invention;

FIGS. 14A-14B illustrate an exemplary embodiment of assembling RFID tags wherein an FSA process is used to assemble the NanoBlock™ devices 110 into the holes in the substrate assembly;

FIG. 15 illustrates an exemplary embodiment of an RFID tag formed on a substrate and exemplary locations where the RFID tag can be cut for singulation;

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention. The following description and drawings are illustrative of the invention and are not to be construed as limiting the invention.

Figure 1:
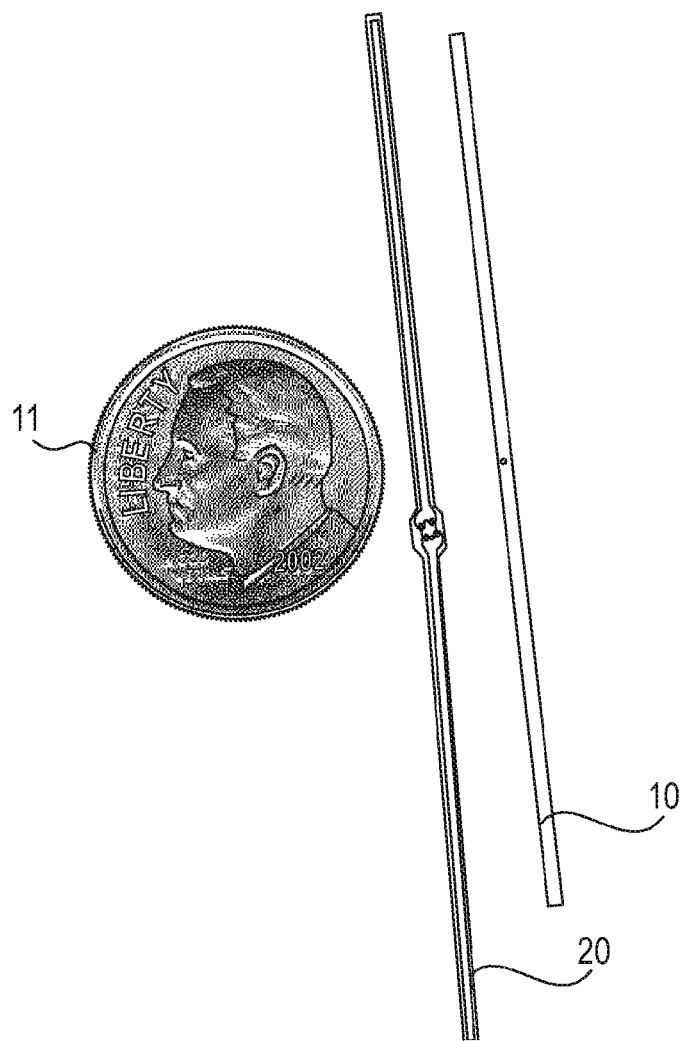
FIGS. 1-2 compare actual sizes of exemplary RFID filaments or threads made in accordance with embodiments of the present invention to a U.S. dime.
Figure 2:
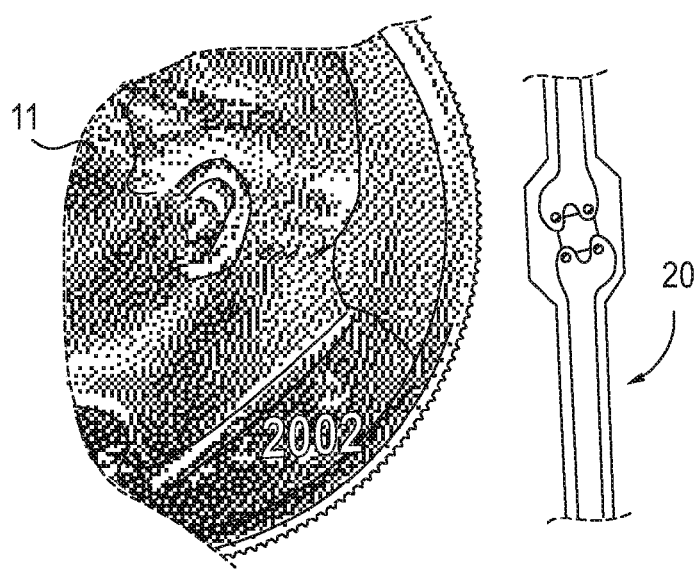
Figure 3:
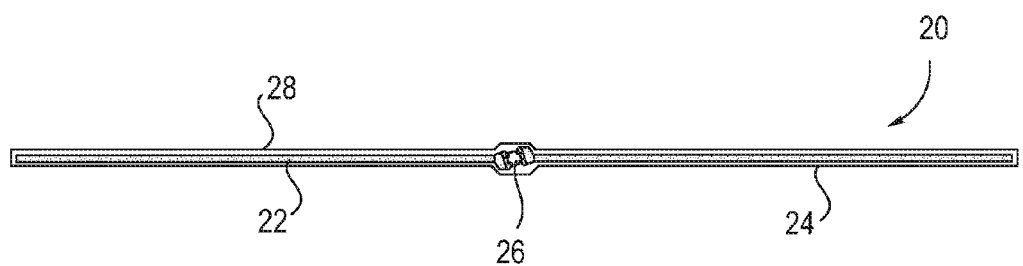
FIGS. 3-4 illustrate in details an exemplary embodiment of an RFID tag having the form of a thread or filament.
Figure 4:
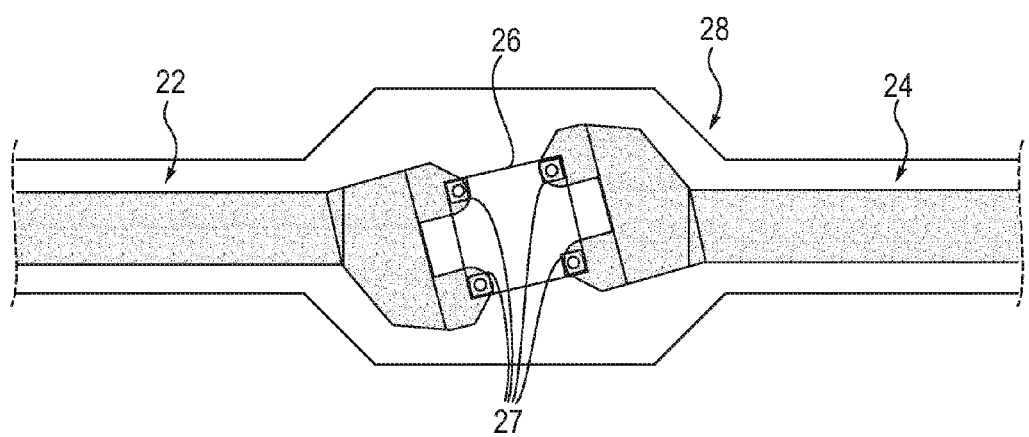

In one embodiment we describe a form factor for RFID tags, in which the RFID tag is in the form of a thin, flexible strip, reminiscent of a filament 10 or a thread 20. Throughout the document, the RFID devices in the form of such thin, flexible strip, filament, thread, or other suitable structures are referred to as "RFID tags." These RFID tags can be quite small (FIGS. 1 and 2). FIGS. 1 and 2 show photographic examples of electronic assemblies for RFID applications comparing the filament 10 and thread 20 of RFID to a U.S. dime. FIGS. 3 and 4 illustrate that in one embodiment, an RFID tag 20 comprises a flexible substrate 28 (in one embodiment, a plastic film), an integrated circuit 26 embedded within the flexible substrate 28, and two conductive films 22 and 24 formed on top of the flexible or plastic substrate 28. The conductive films 22 and 24 are in electrical connection to the integrated circuit 26 that serve as antennas.

FIG. 4 shows a close up portion of the RFID tag 20 shown in FIG. 3. In one embodiment, the RFID tag 20 includes a plurality of bonding pads 27 (or electrical connections) located on the integrated circuit (IC) 26. The bonding pads can be placed around the center or the edges of the integrated circuit 26, or at convenient locations on the integrated circuit. In one embodiment, the two conductive films 22 and 24 are connected to the integrated circuit 26 on opposite corners or in diagonal corners of the IC 26.

Figure 5A:
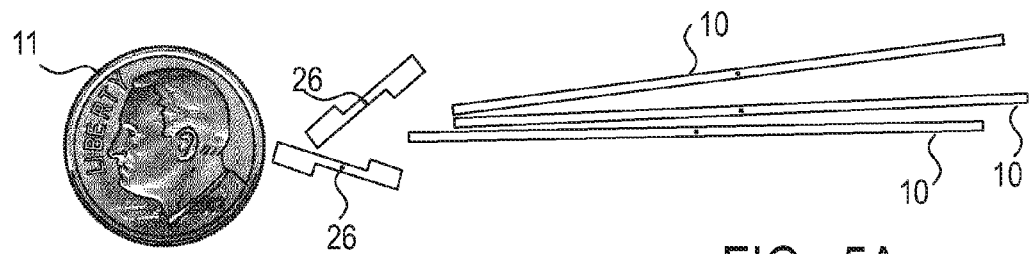
FIGS. 5A-5C illustrate more examples of an RFID tag having a filament structure using NanoBlock™ ICs as integrated circuit (NanoBlock™ is a trademark of Alien Technology Corporation)
Figure 5B:
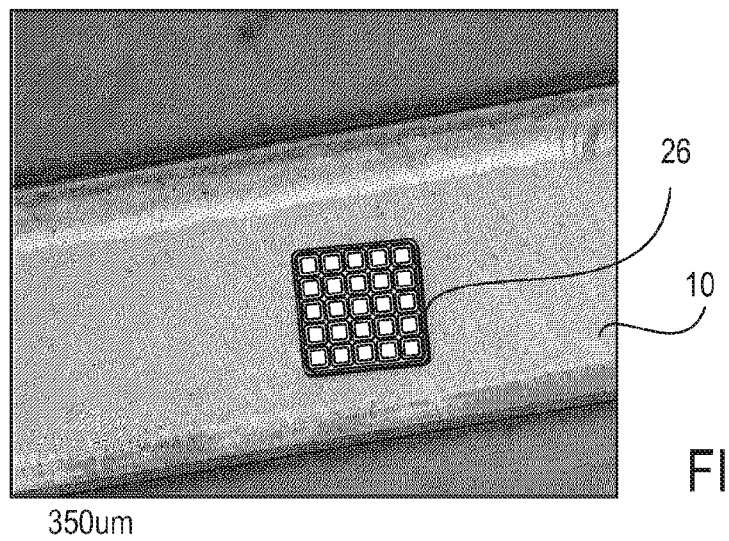
Figure 5C:
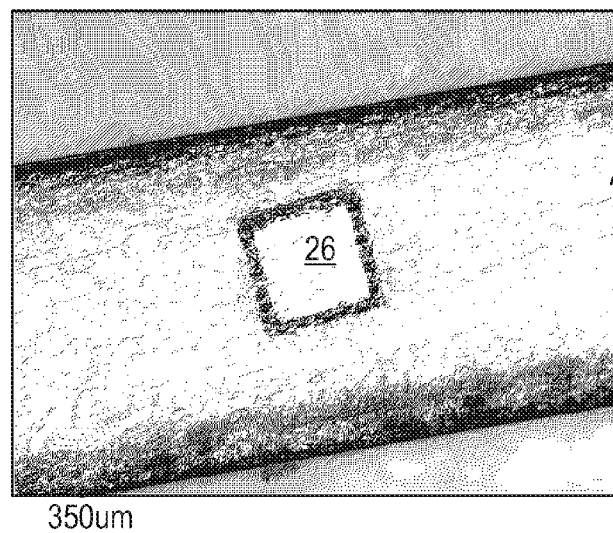

FIGS. 5A-5C illustrate more examples of an RFID tag having a filament structure using a NanoBlock™ IC as an integrated circuit. NanoBlock™ is a trademark of Alien Technology Corporation. For clarity purposes, the printed conductors are not shown. FIGS. 5B-5C show the top and bottom view of the RFID tag.

Figure 6:
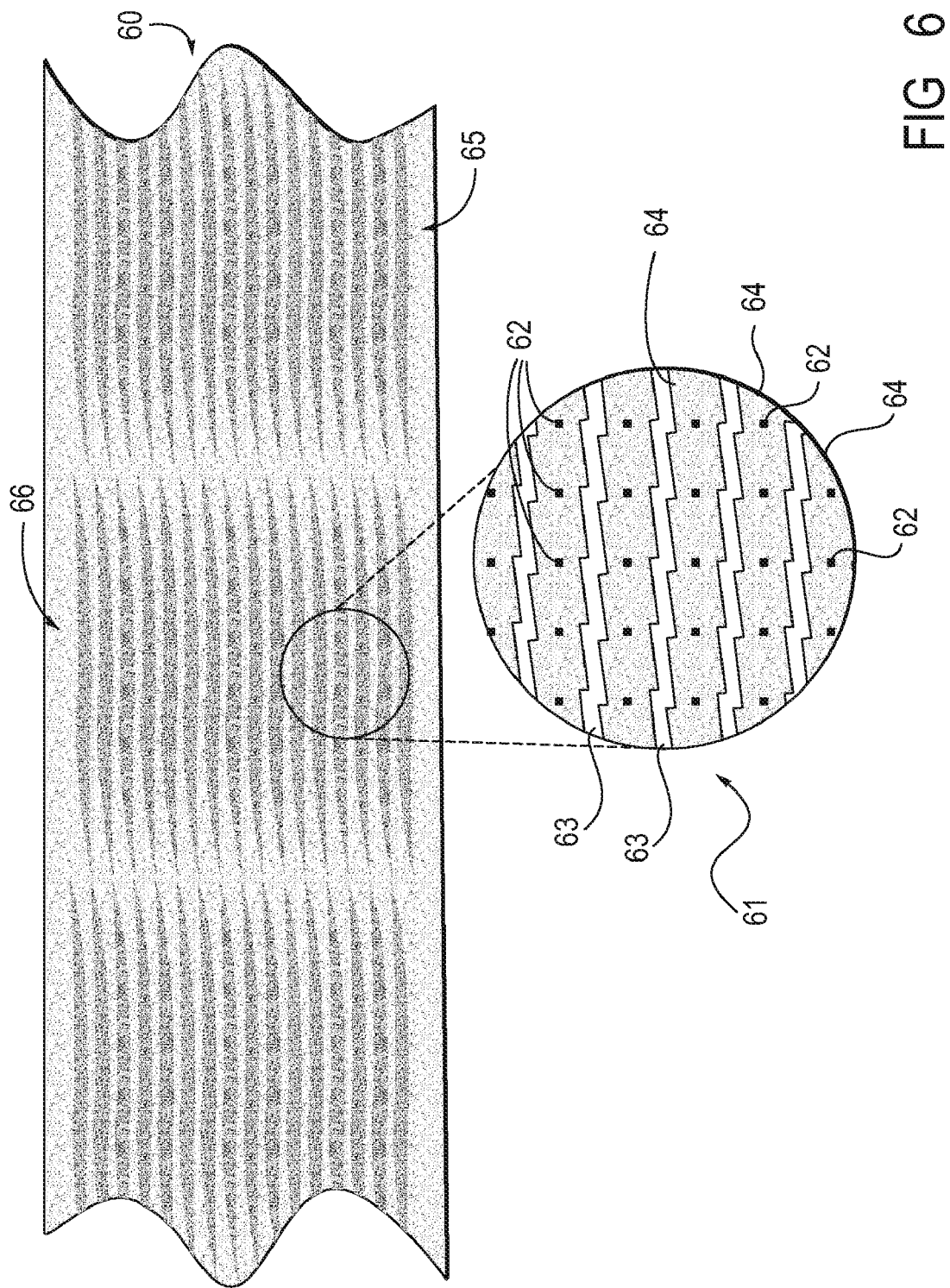
FIG. 6 illustrates a densely-packed array of filament RFID tags formed on a flexible or plastic sheet.

In one embodiment, a fluidic self assembly (FSA) process is used to form densely-packed array of filament tags on a flexible or plastic sheet. FSA is a process where a plurality of integrated circuit devices (such as NanoBlock™ ICs) are dispensed in a slurry. The slurry with the integrated circuits is dispensed over a substrate configured with receptors for the integrated circuits to be deposited therein. An example of this is shown in FIG. 6. See U.S. Pat. No. 5,545,291 for a description of an FSA process. Each integrated circuit can be a NanoBlock™ IC, which may be formed in the manner described in U.S. Patent Publication No. 2002/0127864-A1 and then placed into or on a receptor using an FSA process.

FIG. 6 is an illustration of one exemplary embodiment of a densely-packed array of filament tags on a substrate such as a plastic sheet 60. Other substrate types (other than plastic) can also be used. The substrate can have a form of a web substrate and is flexible. Each filament tag can later be singulated to form an RFID tag. RFID integrated circuits 62 are deposited in the plastic sheet 60 by FSA. Conductive traces 64 are printed on at least one surface of the sheet to form antennas on the plastic sheet 60. The conductive traces 64 that form the antennas are connected to the RFID integrated circuit 62. The filament tags can then be singulated to form individual RFID tags. An enlarged view 61 shows an array of unsingulated filament tags on the plastic sheet 60, where the array includes multiple RFID ICs 62 (deposited, through an FSA process, along lines formed by receptor locations on the plastic sheet which receive the RFID ICs) which are coupled to multiple conductive traces 64.

In one embodiment, a singulation process is used to separate the array of tags into individual RFID tags; in one exemplary embodiment, the singulation process may be performed by mechanical cutting, sawing, punching, laser ablating, hot-blade knife cutting or other techniques. After the singulation process is completed, an individual RFID tag may look like the RFID tag 20 shown in FIG. 3. Exemplary dimensions of these tags produced from the plastic sheet 60 are described below and shown also in FIG. 10. It can be seen from FIG. 6 that there are subarrays of RFID tags which are separated from each other by saw-tooth shaped gaps 63. It can also be seen that the ICs 62 are deposited in lines which are parallel to the edges of the plastic sheet 60 which may be, in one exemplary embodiment, processed as a web material in a roll to roll web process, such as a type of process which is used to make paper. In one embodiment, the printed conductive traces 64, which are used to form the antenna elements for each tag, are formed at an oblique angle relative to the edges of the plastic sheet 60. In the case of FIG. 6, each conductive trace forms an angle of about 10°. This arrangement tends to optimize (e.g. maximize) the amount of filament RFID tags which can be fabricated in a given area of the plastic sheet 60. It will be appreciated that different layouts, such as angle of the trace relative to the edge of the web material (which will engage the rolls at the beginning and end of the process) may be optimal for RFID tags of different lengths and widths. As shown in FIG. 6, the ends of one group of subarrays, such as the group of subarrays 65, interdigitate or interlace with the ends of an adjacent group of subarrays 66; this additional layout arrangement also tends to maximize the amount of filament RFID tags (or other types of devices) which can be fabricated in a given area of the plastic sheet. The ends of each conductive trace are adjacent to the gaps 63.

Figure 10:
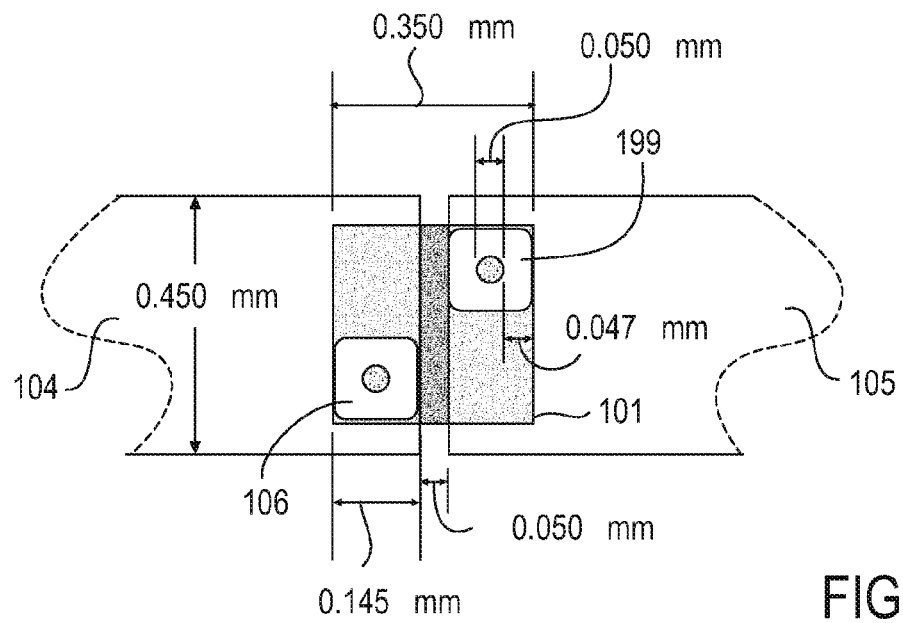
FIG. 10 illustrates exemplary dimensions of an RFID tag made in accordance with embodiments of the present invention.

To maintain flexibility, in one embodiment, the substrate containing the integrated circuit is made of plastic. The substrate can be made of other flexible materials as well. In one embodiment, the thickness of the substrate is less than 1 mm, preferably less than 250 microns, and most preferably less than 125 microns. In one embodiment, the width of the filament RFID tag is less than 5 mm, more preferably less than 3 mm, and could be less than 1 mm. The length of the RFID tag and the antenna formed on the RFID tag substrate can vary but should be at least 5 mm long, more preferably 10 mm long, and could even be as long as 100 mm. Thus, an RFID tag having this form factor will be long in length, thin in thickness and narrow in width. FIG. 10 shows an example of the dimensions of the RFID tag filament relative to an IC, such as an RFID IC.

It is to be appreciated that although fluidic self assembly processes are one desirable way of forming these RFID tag assemblies, other approaches can be used to place integrated circuits on these threads and filaments.

It is clear that such a thin, small, and flexible form factor for RFID enables several novel applications. In one embodiment, the RFID tag assembly is bonded to a nonconductive thread, and then woven into a fabric. The RFID tag can be embedded in paper, with the flexible substrate of the RFID tag allowing the paper to remain flexible. The RFID tag can be adhered to an adhesive material to allow it to attach to another item (e.g., clothing or other merchandise).

Since the RFID tag is small, it can be hidden from view if desired. The RFID tag could be hidden underneath an opaque surface. Alternatively, the RFID tag can be colored black to make it difficult to see, or colored in a way as to blend in with its surroundings. For instance, the RFID tag can be made black or be colored in such a way that makes the RFID tag matches the material that the RFID tag is incorporated into. Further, a laminate may be applied over the top surface (and/or the bottom surface) to protect the RFID tag from being cut out from the object into which it is embedded.

Alternatively, in some applications it might be desirable to make the presence of the RFID filament tag very obvious or easy. The RFID tag could be colored or metalized to stand out against its background in these applications. Thus, the RFID tag could have a distinct appearance that serves a purpose of authenticating the presences of the RFID tag.

The RFID tags can be used to authenticate or identify paper-based products, including currency, legal documents (e.g. a passport or a visa) or other valuable items. The thin size and flexibility characteristics of the RFID tag make it possible to integrate the RFID tag into a label or tape, which can then be attached to an item to provide RFID tag capability. The RFID tag can also be used to authenticate or identify non-paper items as well. For instance, the RFID tag's thin profile and small size make it easier to provide RFID tag capability to small, valuable items such as pharmaceuticals or electronic components. Such a tag could be embedded within a container (such as embedded in a plastic container), or actually mixed in with the contents of a container.

In one embodiment, the RFID tag is deployed (or incorporated) or configured to deploy into another item in a way that the RFID tag spans into a three dimensional structure, e.g., an RFID thread bent into a curved RFID filament or thread or an RFID thread shaped or bent into a wrinkled RFID thread or otherwise an RFID tag shaped in a three dimensional structure. There are a variety of ways of constructing an RFID tag to include integrated circuits, flexible polymers, flexible substrate, and conductive traces. Following are some illustrative examples. While these structures can be used for narrow filament tags, it should also be recognized that more conventional RFID tag structures can also be built using these structures.

Figure 7:
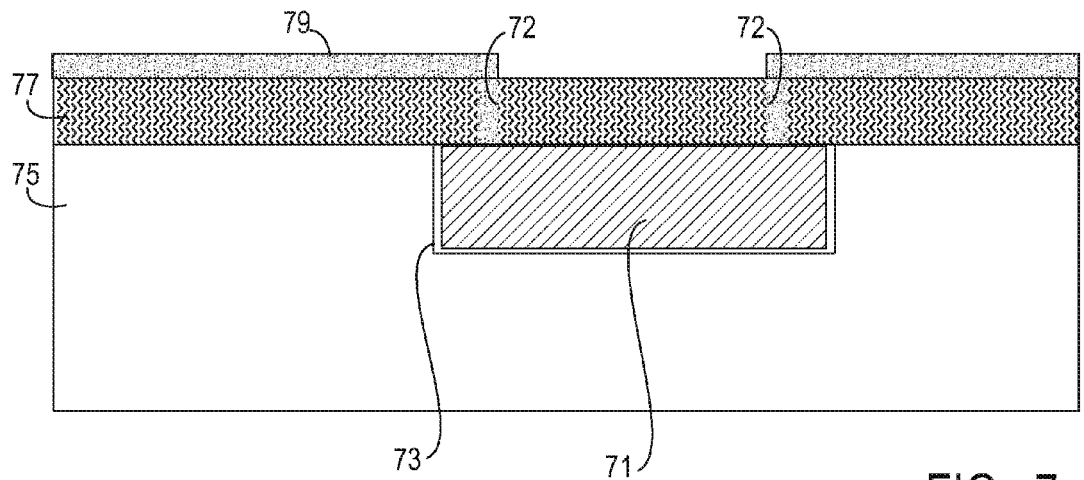
FIG. 7 illustrates an exemplary embodiment of an RFID tag.

FIG. 7 shows, in a cross-sectional view, one construction of an RFID tag. An RFID tag shown in FIG. 7 can be one of the RFID tag shown in FIG. 6. In one exemplary method for forming this structure, an integrated circuit 71 is deposited in a receptor hole 73 in the base film (a flexible or plastic substrate 75) using an FSA process. In one embodiment, the integrated circuit 71 is positioned or deposited such that it is coplanar with the flexible substrate 75. In one embodiment, coplanar refers to a configuration where the integrated circuit 71 is deposited in the substrate 75 such that a surface of the integrated circuit 71 is flush with a surface of the substrate 75. In one embodiment, coplanar refers to a configuration where the integrated circuit 71 is deposited in the substrate 75 such that a surface of the integrated circuit 71 is below a surface of the substrate 75. In one embodiment, coplanar refers to a configuration where the integrated circuit 71 is deposited in the substrate 75 such that a top surface of the integrated circuit 71 shares essentially the same plane as the top surface of the substrate 75.

Still with FIG. 7, a planarization layer 77 is formed on top of the substrate 75 and integrated circuit 71. Via holes 72 are formed in the planarization layer to expose the contact pads (not shown) on the integrated circuit 71. A metal interconnection 79 (or metal traces) is then made to both provide a connection to the pads on the integrated circuit as well as to form antennas for the RFID tag. While photolithographic methods can be used to form the metal traces it is also possible to simply print conductive inks on the substrate 75 to form the antennas. This printing operation simultaneously forms an electrical connection to the integrated circuit 71 and forms the antenna elements. The RFID tag shown in FIG. 7 may be similar to the tag 20 shown in FIG. 3. It is to be noted that the RFID tag shown in FIG. 7 is not drawn to scale.

Additionally, while it is possible to print specific antenna traces, it is also possible to blanket coat a nearly-continuous film of conductor on top of the planarization layer, leaving only the center portion of the integrated circuit exposed. When the filament tags are cut out from the sheet, the simple act of separating the filaments will form the antennas. In one embodiment, a subtractive method is used to form the antenna traces on the planarization layer. The subtractive method includes techniques such as chemical etching, laser ablation, and mechanical removal in which a continuous layer is first applied and then portions are etched away by chemical etching, laser ablation, or mechanical removal to create an appropriate pattern.

Figure 8:
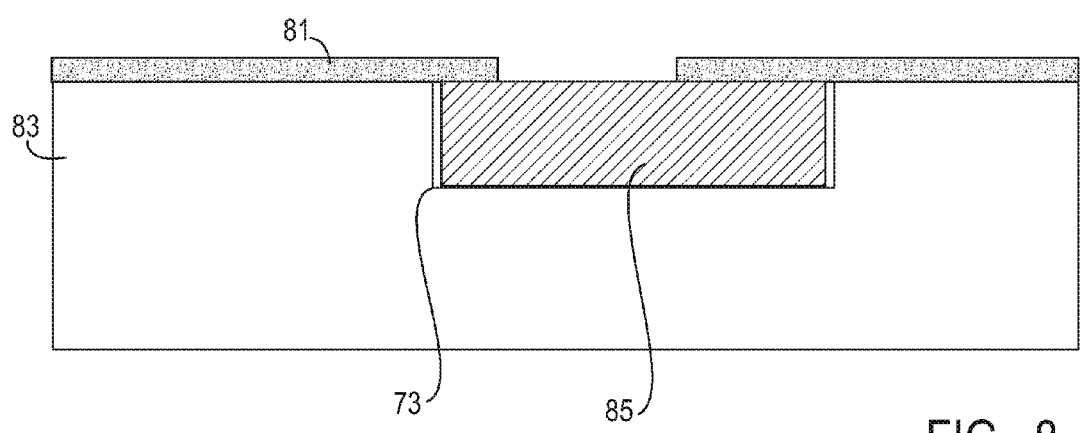
FIG. 8 illustrates another exemplary embodiment of an RFID tag.

In one embodiment, as shown in FIG. 8, an RFID tag is formed without a planarization layer. In FIG. 8, an integrated circuit 85 is deposited in a receptor hole 73 in a substrate 83 (using an FSA process in one embodiment). A metal interconnection 81 is formed directly on the top surface of the substrate 83. Of course, it is possible to subsequently attach other materials to the top or bottom surface of the RFID tags shown in FIG. 7 or FIG. 8. No planarization layer is used in the RFID tag shown in FIG. 8. The metal interconnection 81 can be formed as a substantially continuous film over the substrate 83 and the integrated circuit 85. An area (e.g., approximately in the center portion) on the integrated circuit 85 is left exposed.

Figure 9A:
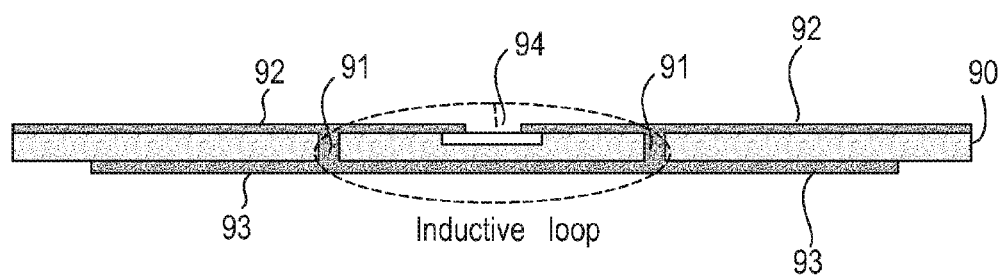
FIGS. 9A-9B illustrate an exemplary embodiment of an RFID tag with top and bottom conductors forming an inductive loop.

FIG. 9A shows, in a cross-sectional view, another structure for an RFID filament (thread) tags, in which via holes 91 formed through a substrate 90 (e.g. a plastic substrate) provide access for electrical connection between a conductor 92 (e.g. an antenna element) formed on a top surface of the substrate 90 to a conductor 93 (e.g., an antenna element) formed on the bottom surface of the substrate 90. Such an RFID tag architecture will enable the antenna to form an inductive loop structure, which can be a valuable design feature in certain embodiments for maximizing the performance of certain RFID tags. In one embodiment, the substrate 90 includes an integrated circuit 94 which can be a NanoBlock™ IC.

While FIG. 9A does not show the presence of a top planarization layer, it should be recognized that it is possible to form an equivalent structure with a planarization layer as shown in FIG. 7 with via holes in the planarization layer and in the substrate to allow for electrical connection between the conductor on a top surface and a conductor on a bottom surface.

Figure 9B:
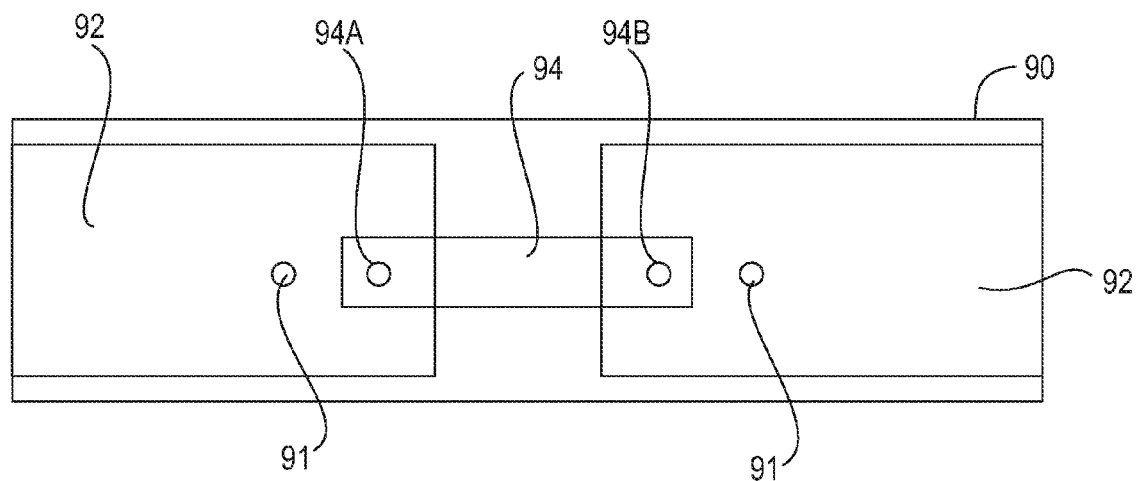

FIG. 9B shows a top view of the RFID tag of FIG. 9A. The IC 94 is shown electrically connected to the conductors 92 formed on the top surface of the substrate 90 and to the conductor 93 formed on the bottom surface of the substrate 90. The conductors 92 and 93 may be printed on the substrate 90 or may be formed by other methods. In the example shown in FIG. 9B, the conductors 92 do not cover the entire top surface of the substrate 90, and these conductors have been shown, for purposes of illustration, as transparent objects even though they may not be transparent. The conductor 93 may or may not cover the entire bottom surface of the substrate 90 and may or may not be transparent. The via holes 91 are shown adjacent the ends of the two top conductors 92. The IC 94 is coupled electrically to the conductors 92 through two bonding pads 94A and 94B on the IC 94. In one exemplary embodiment of a process to make the RFID tag shown in FIGS. 9A and 9B, the via holes 91 may be created with laser ablation which drills through the plastic substrate. In an alternative embodiment, rather than using the via holes 91 to electrically connect a top conductor to a bottom conductor, the top and bottom conductors may be electrically connected around the edges of the flexible substrate. One way of providing such a connection is by coating or dipping the ends (or certain other portions which will not short circuit the IC) of the thread in a conductive ink. In certain embodiments of the RFID tag shown in FIGS. 9A and 9B, the electrical connection between the top and bottom conductors can help prevent against damage to the IC 94 in the thread from electrostatic discharge and can also help to cancel reactance from the IC 94. In one embodiment, the RFID tag in FIG. 9A, has the contact to the bottom conductor (through the via holes) configured or is used to match the impedance of the antenna elements and the RFID IC 94.

FIG. 10 shows some illustrative dimensions for filament RFID tag where the substrate which holds an IC 101 of the RFID tag is not shown. In one embodiment, the substrate may be only minimally wider than the antenna elements 104 and 105. The antenna elements 104 and 105 are shown electrically coupled to the IC 101 through bonding pads 106 and 199.

It can be seen from FIG. 10 and its accompanying description that the width of the RFID tag may be equal to or slightly greater than the IC 101 (e.g. an RFID IC or a NanoBlock™ IC) contained within the RFID tag. In the case of FIG. 10, the substrate may be slightly wider (e.g. about 0.10 mm or 0.20 mm wider) than the IC 101 or it may be substantially equal in width to the width of the IC 101. Further, the length of the RFID tag may be at least 10 times the length of the IC 101 and more preferably may be at least 30 times the length of the IC 101 and could even be over 100 times the length of the IC 101. The length of the RFID tag may, in one embodiment, be optimized to cancel the electrical reactance of the RFID IC 101 in the RFID tag. Further, the structure of the antenna elements 104 and 105 may be designed to substantially or approximately match the impedance of the antenna elements to the input impedance of the RFID IC 101.

Exemplary RFID tags of the present invention can be formed from integrated circuits comprising two interconnection pads or more than two interconnection pads. For example, RFID tags with three interconnection pads on the integrated circuit and RFID tags with four interconnection pads on the integrated circuit can be used. In some embodiments one interconnection pad serves as a local ground connection (which can still be attached to an antenna), one or more interconnection pads serve as an additional antenna connection, and one or more pads can be connected to an external capacitor or other electrical element to enhance the RFID tag performance. It should be recognized that designs with 3 or 4 integrated circuit connection pads can be used in the designs and applications described herein.

In some embodiments, an RFID IC may be created as a NanoBlock™ IC (e.g. using processes described in U.S. Patent Publication No. 2002/0127864-A1) or as a conventional IC (e.g. without the wedge-shaped sides of embodiments of a NanoBlock™ IC).

Figure 11:
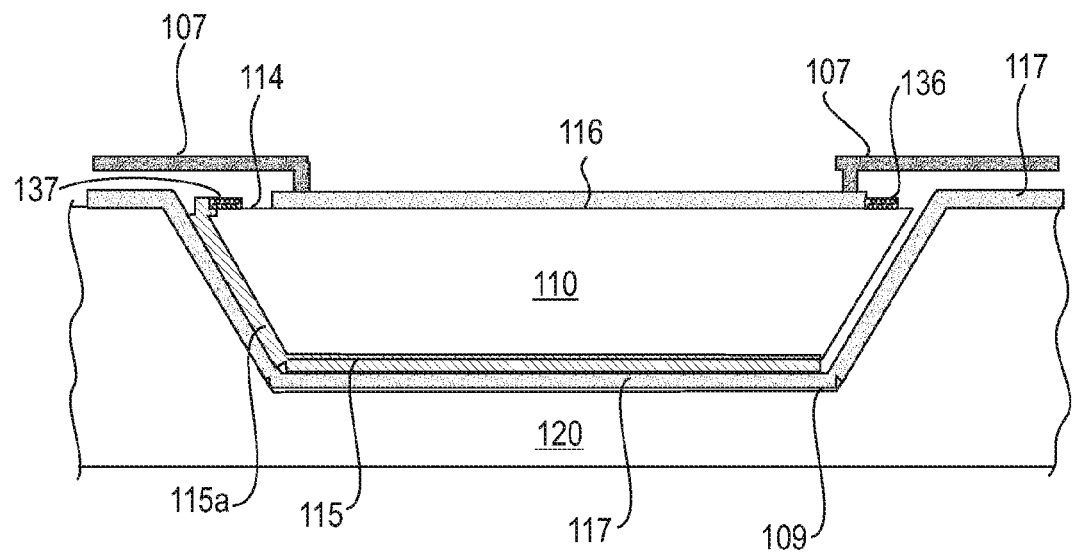
FIG. 11 illustrates an exemplary embodiment of an RFID tag that does not require precise alignment and orientation when being deposited into a substrate.

FIG. 11 illustrates an exemplary embodiment where an RFID IC can be assembled into a substrate where proper alignment or orientation of the RFID IC to be deposited into a receptor in the substrate is more relaxed or less stringent. As shown in FIG. 11, an RFID IC 110 is placed into a receptor 109 which includes a conductive element 117 that serves as an antenna element. The conductive element 117 is thus located below the RFID IC 110. This conductive element 117 may be referred to as a bottom antenna and it is electrically coupled (resistively or capacitively) to the IC 110. The RFID IC 110 is also electrically coupled (resistively or capacitively) to a conductive element 107 which is above the RFID IC, and the conductive element 107 may be referred to as a top antenna. In one embodiment, the RFID IC 110 is electrically coupled to the top antenna through a contact 116 provided on a top surface of the RFID IC 110 and is electrically coupled to the bottom antenna through a contact 115 provided on a bottom surface of the RFID IC 110.

The IC bonding pads 137 and 136 on a top surface 114 of the IC 110 make electrical contact, respectively, with a bottom contact 115 and a topside contact 116. In one embodiment, as shown in FIG. 11, the bottom contact 115 electrically connects with the bonding pad 137 and is wrapped around a side of the IC 110 (which resembles a block) and continues on the bottom side of the IC 110. In one embodiment, the IC 110 is shown as having a wedge-shaped side but is will be appreciated that a rectangular-shaped side may also be used in certain embodiments.

In one embodiment of this RFID tag, the size of the top contact 116 on a top surface of the RFID IC is significantly larger than a bonding pad 136 on the top of the RFID IC 110, and the size of the bottom contact 115 on the bottom surface of the RFID is significantly larger than another bonding pad 137 on the top of the RFID IC 110. In this embodiment, the size of the top contact 116 is about the same size as the entire top surface of the RFID IC 110, and the size of the bottom contact 115 is about the same size as the entire bottom surface of the RFID IC 110. In one embodiment, the RFID IC 110 includes an interconnect 115a which extends from a bonding pad 137 on the top of the IC 110, around a side of the IC 110 to the bottom of the IC 110, and the bottom portion of this interconnect 115a may be the bottom contact 115. In one embodiment, the RFID tag may include a planarization layer or a dielectric layer (not shown) formed on top of the spacer layer 120 and the IC 110 similar to the RFID tag shown in FIG. 7.

The RFID IC 110 is supported, in one embodiment, within a spacer layer 120 which is coupled to the top antenna 107 and to the bottom antenna 117. The receptor or opening 109 in the spacer layer 120 is considerably larger than the size of the RFID IC 110. This opening 109 is not designed to relatively precisely match the size of the block of the RFID IC 110. Rather, the RFID IC 110 fits in the opening 109 without aligning to the perimeter of the opening 109. In one exemplary embodiment the opening is at least 50% larger in area than the area of the bottom surface (or area of the top surface) of the block of the RFID IC 110. Further, the geometry of the opening 109 does not need to match the geometry of the RFID IC 110; for example, the opening 109 may have a circular geometry and the RFID IC 110 may have a rectangular (e.g., square) geometry. Even though an FSA process may be used to place the RFID ICs 110 into the openings 109, the RFID ICs 110 do not need to be aligned to the perimeter of the opening 109. Thus, after an FSA process, the RFID ICs 110 may have different rotational orientations within the openings 109. The RFID ICs 110 in this embodiment are designed to operate properly whether they are oriented up or down (relative to the layer of circuitry in the RFID IC 110) because there is only one electrical contact on a top surface of the RFID IC 110 (contact 116) and only one electrical contact on a bottom surface of the RFID IC 110 (contact 115). Since these contacts cover a large portion of both surfaces (top and bottom) of the RFID IC 110 and since there are no other electrical contacts on these surfaces, it is possible to deposit the RFID ICs 110 into the openings 109 without aligning them in the openings 109 and without needing to align small bonding pads on the RFID ICs 110 to interconnects on the top and bottom antennas. The embodiments discussed may be used for thread tags or non-thread tags. These embodiments allow an FSA process in which blocks, each containing a functional element (e.g. an RFID IC), are mixed in a fluid to form a slurry and then the slurry is deposited onto a substrate having openings wherein the openings are substantially larger and/or having different shapes than the blocks and/or the perimeters of the blocks are not aligned with the perimeters of the openings after the FSA process is completed.

Exemplary methods for fabricating RFID thread tags are detailed starting from pre-formed, two-terminal, RFID Nano-Block™ devices that have one electrical contact 116 located on the topside of the device and the other electrical contact 115 located on the bottom of the device. The methods are amenable to implementation as a web based manufacturing process.

First, an RFID NanoBlock™ device 110 with top and bottom electrical contacts 115 and 116 as shown in FIG. 11 is provided. The electrical contacts 115 and 116 may be formed from, or include a full or partial layer of, a conducting adhesive material, such as a silver-particle loaded thermal plastic or b-staged epoxy, low temperature solder, cold-weldable material such as gold, etc. Alternatively, the electrical contacts 115 and 116 may be covered by a thin layer of a non-conducting adhesive material, such as a PSA, hot-melt adhesive, etc, or non-conducting b-staged epoxy (in order to form, in one embodiment, a capacitive contact).

Next, the RFID NanoBlock™ device 110 is deposited in a substrate to form an RFID tag. In one embodiment, the RFID tag is formed on a web-base material or substrate and then singulated into an individual RFID tag. Thus, a plurality of RFID tags can be formed on one substrate. FIG. 12 illustrates an exemplary embodiment of assembling RFID tags in accordance with some embodiments of the present invention. In one embodiment, an FSA process is used to assemble a plurality of RFID ICs into the substrate of the RFID tags. The spacer layer 120 is adhered to a substrate that is a web-based material. In FIG. 12, a substrate 129 having one or more strips of a NanoBlock™ spacer layer 120 in which NanoBlock™ device receptor site holes 121 have been formed is provided. The substrate 129 may have a form of a web substrate as shown in FIG. 12. The cut-off end of the web substrate is to indicate that what is shown in the figure is a section from a long web (processed in a roll to roll web process, such as a paper making process).

As shown in FIG. 12, the holes 121 have a circular shape. These circular holes 121 can be fabricated by punching, embossing, drilling, laser cutting or ablation, etc. The holes 121 may have alternative geometries such as rectangular or square holes or have other regular shapes or even be irregularly shaped. To facilitate assembly, the spacer layer 120 may be coated on its front and or back side with an adhesive material, such as a PSA, hot-melt adhesive, etc, or non-conducting b-staged epoxy or a UV-curable polymeric material (not shown). The thickness of this spacer layer 120 and the size of the holes 121 are made such that no more than one NanoBlock™ device 110 will remain in each hole 121 after completion of the FSA process.

As way of an example, in one embodiment in which the NanoBlock™ devices 110 are nominally square (as viewed from the top) and the holes 121 in the spacer layer 120 are round, the spacer layer 120 thickness would be selected to be approximately equal to the thickness of the NanoBlock™ devices 110, and the hole diameter 121 could be in the range of 1.41 to 1.8 times the nominal NanoBlock™ device 110 width.

Next, in one embodiment, a bottom-antenna layer 130 is attached to the spacer layer 120 as illustrated in FIGS. 13A-13B. In one embodiment, the bottom-antenna-layer 130 is fabricated of a conducting material or is a layered structure that includes a conducting layer 131. FIGS. 13A-13B show top and end-on views, respectively, of the bottom-antenna layer 130. To facilitate assembly, areas of one or both sides on the bottom-antenna-layer 130 may be coated with an electrically conductive adhesive material (or non-conductive adhesive material in the case of a capacitive contact). In one embodiment, the electrically conductive (or non-conductive) adhesive material can be applied by lamination or screen printing (or other suitable techniques) to the bottom-antenna-layer 130. In addition, some areas, including those that will contact either the top or bottom contacts of the NanoBlock™ devices 110, may be coated with an electrically conductive adhesive such as the conducting adhesive strips 132 shown in FIGS. 13A and 13B (or a thin layer of a non-conducting adhesive in the case of a capacitive contact).

In one embodiment, the spacer layer 120 (or a plurality of spacer layer strips 120) is attached to the bottom-antenna layer 130 by static pressure, lamination, etc., where one or more of the adhesive layers 132 discussed above bonds the pieces together. In one embodiment, the spacer layer 120 and the bottom-antenna layer 130 forms the substrate 129 for the RFID tag.

Figure 14A:
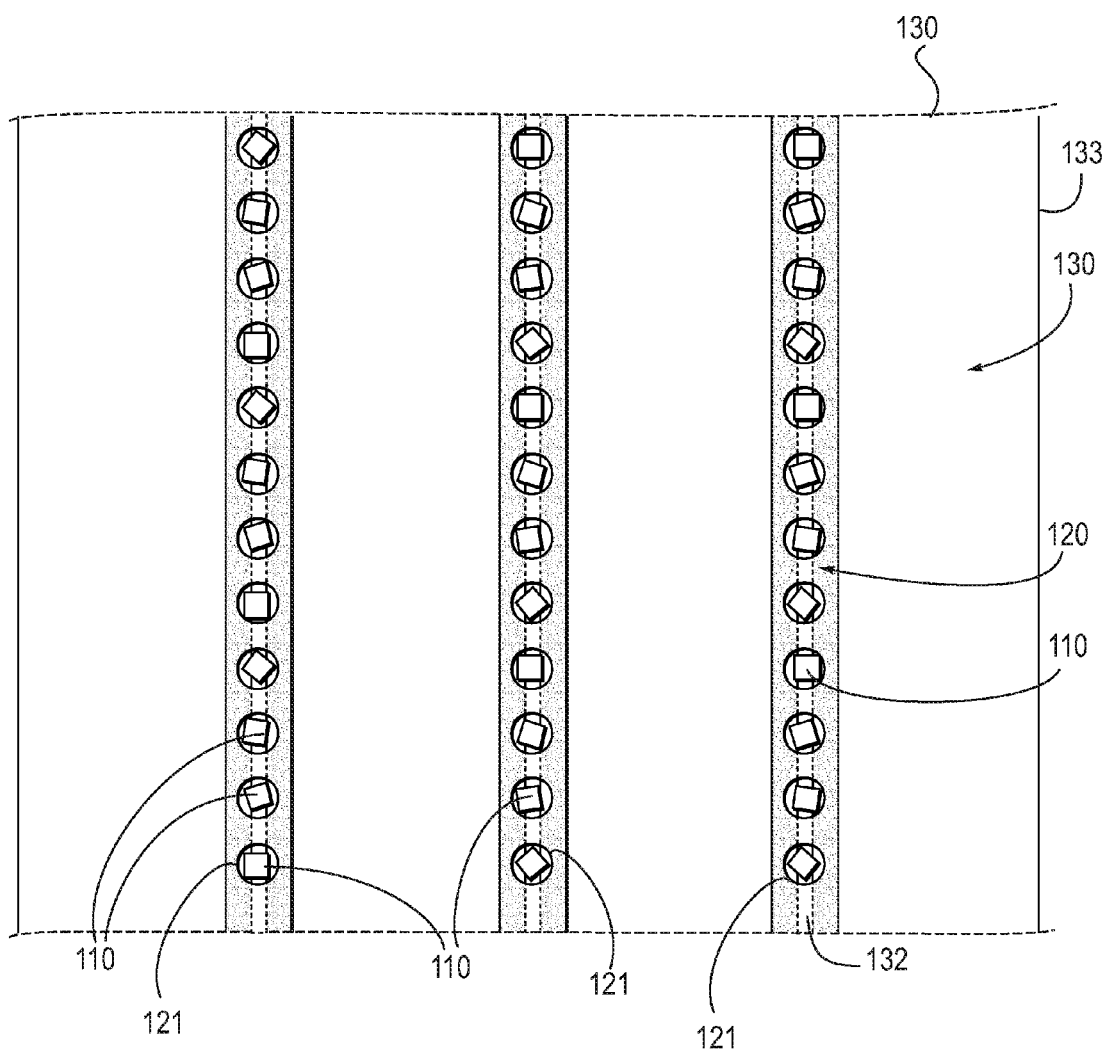

In one embodiment, an FSA process is used to assemble the NanoBlock™ devices 110 into the holes 121 in the substrate assembly. (See FIGS. 14A and 14B). The ICs (such as NanoBlock™ devices 110) are mixed with a fluid to form a slurry and the slurry is dispensed over a substrate (such as bottom antenna layer 130 with layer 120), causing at least some of the ICs, shaped as blocks, to fall into and remain in the holes (e.g. holes 121) in the spacer layer 120. FIGS. 14A and 14B show the result of an FSA process (or an alternative process) which was used to create the structure shown in these FIGS. 14A and 14B. Note that the ICs 110 are not axially aligned and are not rotationally aligned relative to their respective holes 121; thus, relative to the edge 133, the ICs 110 have different rotational orientations and they also have, relative to their respective hole 121, different axial positions within their respective hole 121 (e.g. some are positioned to the left of center, some are positioned to the right of center, etc.).

Depending on the location and type of adhesive materials employed, the NanoBlock™ devices 110, if desired, might now be attached to the substrate assembly by a hot-roll lamination process. In one embodiment, the spacer layer 120 is semi-transparent. The substrate assembly includes (as shown in FIG. 14A) three strips of spacer layers 120 laminated onto a bottom antenna layer 130. It is to be expected that more or less than three spacer layers 120 maybe included. In one embodiment, each strip of spacer layer 120 is aligned over one of the conducting adhesive strips 132 which are adhered onto the bottom antenna layer 130.

FIG. 14B shows a close-up cross-section of a NanoBlock™ device 110 in a receptor site (hole 121) formed by an assembly of a strip of spacer layer (e.g. spacer layer 120) and the bottom antenna layer (e.g. layer 130). In one embodiment, individual spacer layer strips 120 are laminated over individual conducting adhesive strip 132 which is adhered on the bottom antenna layer 130. Alternatively, the spacer layer strips 120 are laminated over one continuous adhesive strip 132. As noted in FIG. 12, the adhesive layers 132 on the top and bottom of the spacer layer strip 120 are employed to hold the assembly together, and the NanoBlock™ device 110 is held in place by a portion of the conducting adhesive strip 132 originally part of the bottom antenna layer 130.

Next, as shown in FIG. 15, in one embodiment, a top antenna layer 135 is laminated over the spacer layer 120 that has the RFID IC 110 deposited therein. In one embodiment, the top antenna layer 135 is fabricated of a conducting material or is a layered structure that includes a conducting layer 136 and has a structure, in one embodiment, which is similar to or the same as the structure of the bottom antenna layer 130. In one exemplary embodiment, the top antenna layer 135 includes a conducting layer 136, which may be supported on a plastic substrate (not shown) and conductive adhesive strips 132 adhered to the conducting layer 136. The conductive adhesive strips 132 on the top antenna layer may be arranged in the same pattern as in the case of the bottom antenna layer (see, e.g. FIG. 14A). With the presence of an adhesive layer that is conductive as the conductive adhesive strips 132, the conducting layer 136 may be eliminated.

In another embodiment, areas of one or both sides on the top antenna layer 135 may be coated with an electrically conductive or non-conductive adhesive material. In addition, some areas, including those that will contact either the top or bottom contact pads of the NanoBlock™ devices 110, may be coated with an electrically conductive adhesive (e.g. conducting adhesive strips 132) or a thin layer of a non-conducting adhesive. In another embodiment, the top antenna layer 135 is laminated over the spacer layer 120 such that the conducting layer 136 makes electrical contact, resistive or capacitive, with any NanoBlock™ devices 110 present or deposited in the spacer layer 120.

Figure 16:
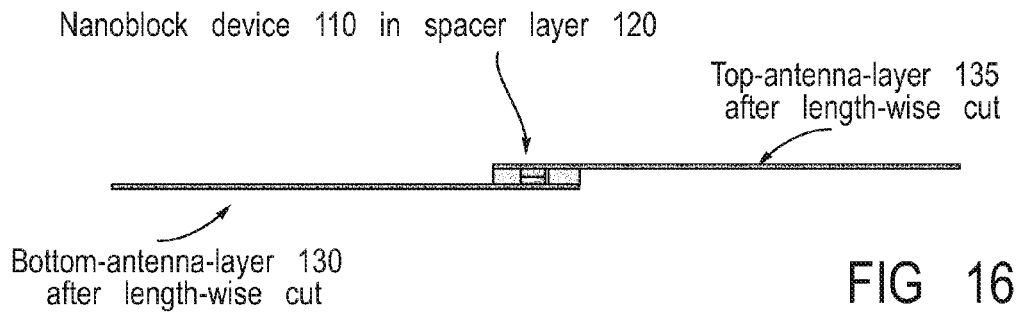
FIG. 16 illustrates a cross-sectional side view of singulated RFID tag.

In one embodiment, the RFID tags are formed on a web substrate. The web substrate includes one or more spacer layer 120 each of which having receptors 121 for the RFID ICs 110 to be deposited therein. After the RFID ICs 110 are deposited and various layers laminated or formed as previously described, each individual RFID tag can be singulated from the web substrate. The web substrate is cut (e.g., in a web length-wise manner in order to separate sheets of connected RFID tags. FIG. 15 illustrates two exemplary locations on the web substrate where an RFID tag formed can be singulated. FIG. 16 illustrates an end-on view of a sheet that has an RFID tag singulated from the web substrate. The cutting operation may be performed by mechanical cutting, sawing, punching, laser ablating, hot-blade knife cutting, gas-jet cutting, etc.

Figure 17:
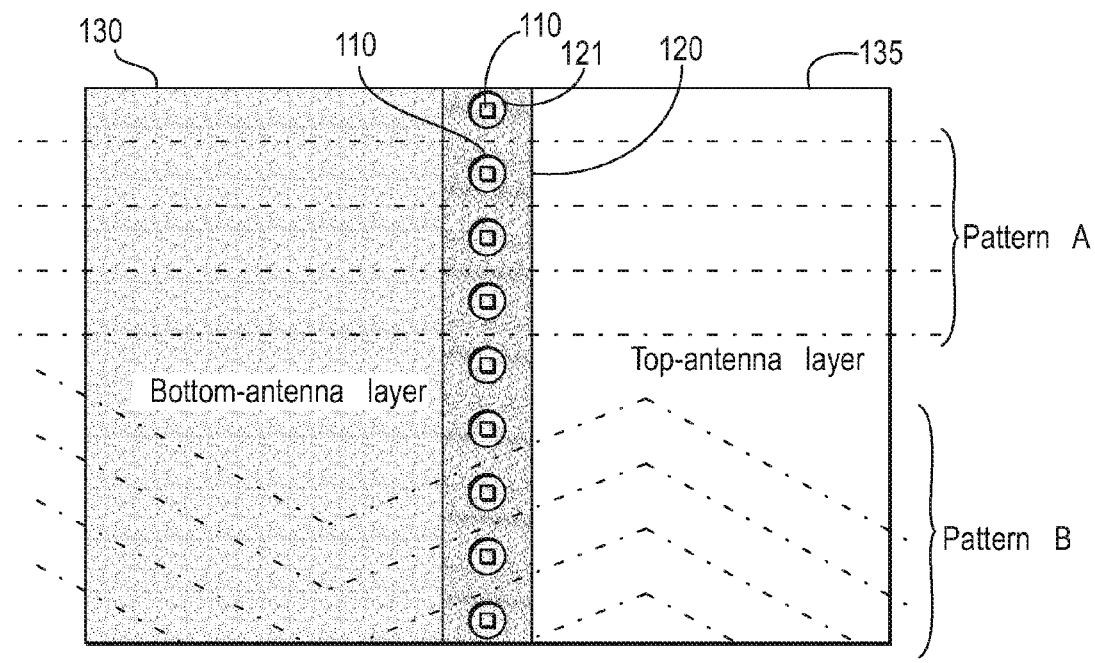
FIG. 17 illustrates exemplary cutting patterns for singulating RFID tags formed on a substrate.
Figure 18:
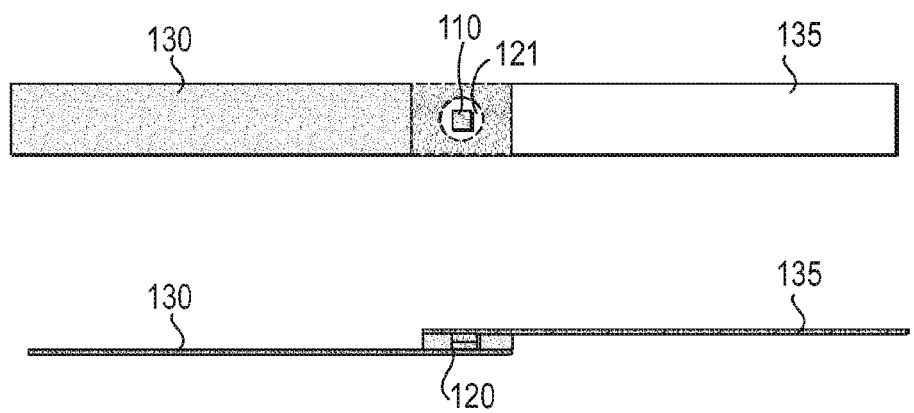
FIG. 18 illustrates a top-view and a cross-sectional view of a singulated RFID tag.

When formed in a web substrate format, at least the top antenna layer 135 and the bottom antenna layer 130 are in continuous or connected form on RFID tag assembly to another RFID tag assembly. FIG. 17 illustrates a semi-transparent top-view of a sheet of connected RFID tags. On the left of the sheet is shown a bottom antenna layer 130 and on the right of the sheet is shown a top antenna layer 135. A strip of spacer layer 120 having deposited therein a plurality of RFID IC 110 (e.g., NanoBlock™ devices) is shown to be attached to the bottom-antenna layer 130 and the top-antenna layer 135. Also shown in FIG. 17 are two examples of how the RFID tags formed on a web substrate can be singulated. Two exemplary cutting patterns, cutting pattern A and cutting pattern B are illustrated in this figure. Each RFID tag can be cut along the dashed lines to be separated from the web substrate. After the RFID tags are formed as previously described, the RFID tags can be singulated. FIG. 18 illustrates semi-transparent top-view and side view of a singulated or separated RFID tag cut using the cutting pattern A. The cutting operation may be performed by mechanical cutting, sawing, punching, laser ablating, hot-blade knife cutting, gas-jet cutting, etc. Cuts can be made straight across the sheets or in more complicated patterns in order to affect electrical characteristics of the resulting antenna or physical or design characteristics of the tags. In one embodiment, holes may also be formed in the antenna layers to affect form, function, and utility.

Figure 19:
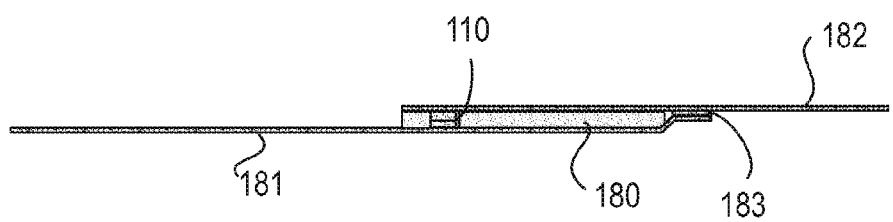
FIG. 19 illustrates an RFID tag assembly that includes an inductor.

An alternate tag assembly that includes an inductor in parallel with the NanoBlock™ device is shown in FIG. 19. In one embodiment, the RFID tag includes one additional strip of conducting adhesive per spacer layer strip, applied to either the top or bottom antenna layer, and wide spacer layer strips. The inductor formed can improve tag electrical performance. FIG. 19 illustrates an end-on-view of an RFID tag in a sheet format.

The RFID tag includes a wide spacer layer 180, an additional strip of conducting adhesive 183, applied to either the bottom antenna layer 181 or top antenna layer 182. The RFID tag assembly shown in FIG. 19 is similar to the tag assembly shown in FIG. 15 and includes the bottom antenna layer 181 (which has a conducting layer which serves as the bottom antenna and a conducting adhesive strip which electrically connects the bottom antenna to the bottom contact on the RFID IC 110) and the top antenna layer 182 (which has a conducting layer which serves as the top antenna and a conducting adhesive strip which electrically connects the top antenna to the top contact on the IC 110) and a wide spacer layer 180 which includes an opening to receive the RFID IC 110.

During the top antenna layer 182 lamination, the bottom antenna layer 181 and the top antenna layer 182 are electrically joined along the added conducting adhesive 183 strip. In the finished tag, the conduction path around the wide spacer layer 180 forms an inductor loop in parallel with the RFID IC 110 (e.g., a NanoBlock™ device), thus enhancing electrical performance in certain embodiments.

While certain exemplary embodiments have been described and shown in the accompanying drawings, it is to be understood that such embodiments are merely illustrative and not restrictive of the current invention, and that this inven-

The invention claimed is:

1. An RFID tag comprising:
   a flexible substrate;
   an integrated circuit at least partially embedded within the flexible substrate, the integrated circuit having a top surface that is substantially coplanar with the flexible substrate;
   conductive elements formed on the flexible substrate and electrically connected to the integrated circuit, the conductive elements also serving as an antenna for the RFID tag; and
   wherein the conductive elements are formed on a top surface and bottom surface of the flexible substrate, and wherein an electrical connection is provided to connect a conductive element of the conductive elements on the bottom surface to the integrated circuit.

2. The RFID tag of claim 1 further comprising a planarization layer formed over the flexible substrate and the integrated circuit and wherein the electrical connection is formed through at least one via hole in the planarization layer.

3. The RFID tag of claim 1 wherein the electrical connection is formed by electrical connection around at least one side of the flexible substrate.

4. The RFID tag of claim 1 wherein a conductive element of the conductive elements formed on the top surface is connected to a pad on top of the integrated circuit.

5. The RFID tag of claim 4 wherein the conductive elements formed on the top surface and on the bottom surface form electrical loop structures, or inductive elements for the RFID tag.

6. The RFID tag of claim 1 wherein a first one of the conductive elements is electrically and mechanically coupled to a first pad on the integrated circuit and a second one of the conductive elements is electrically and mechanically coupled to a second pad on the integrated circuit (IC).

7. The RFID tag of claim 6 wherein the flexible substrate has a length which is at least 10 times the width of a receptor site for the IC and has a form factor of a thread.

8. The RFID tag of claim 7 wherein the antenna formed by the conductive elements is configured to have an impedance that substantially matches an input impedance of the IC.

9. An RFID tag comprising:
   an RFID integrated circuit (IC) deposited in a flexible substrate;
   a first antenna layer coupled to the RFID integrated circuit; and
   a second antenna layer coupled to the RFID integrated circuit, wherein the first antenna layer is above the RFID integrated circuit and the second antenna layer is below the RFID integrated circuit, wherein the RFID integrated circuit is coupled to the first antenna layer at a first contact of the RFID integrated circuit and the RFID integrated circuit is coupled to the second antenna layer at a second contact of the RFID integrated circuit,
   wherein the flexible substrate has a form factor of a thread.

10. An RFID tag comprising:
    an RFID integrated circuit (IC) deposited in a flexible substrate;
    a first antenna layer couples to the RFID integrated circuit; and
    a second antenna layer coupled to the RFID integrated circuit, wherein the first antenna layer is above the RFID integrated circuit and the second antenna layer is below the RFID integrated circuit wherein the RFID integrated circuit is coupled to the first antenna layer at a first contact of the RFID integrated circuit and the RFID integrated circuit is coupled to the second antenna layer at a second contact of the RFID integrated circuit,
    wherein a portion of the first antenna layer is electrically and mechanically coupled to a first pad on the IC and a portion of the second antenna layer is electrically and mechanically coupled to a second pad on the IC, and
    wherein a size of the first pad is about the same size as a top surface of the IC, and wherein a size of the second pad is about the same size as a bottom surface of the IC.

11. An RFID tag comprising:
    an RFID integrated circuit (IC) deposited in a flexible substrate;
    a first antenna layer coupled to the RFID integrated circuit; and
    a second antenna layer coupled to the RFID integrated circuit, wherein the first antenna layer is above the RFID integrated circuit and the second antenna layer is below the RFID integrated circuit, wherein the RFID integrated circuit is coupled to the first antenna layer at a first contact of the RFID integrated circuit and the RFID integrated circuit is coupled to the second antenna layer at a second contact of the RFID integrated circuit,
    wherein the flexible substrate comprises a receptor for the IC and wherein an angular orientation of the IC is not fixed by the receptor.

12. The RFID tag of claim 11 wherein the angular orientation is capable of being a plurality of different orientations.

* * * * *